United States Patent [19]
Hori et al.

[11] Patent Number: 5,411,631
[45] Date of Patent: May 2, 1995

[54] DRY ETCHING METHOD

[75] Inventors: Masaru Hori, Aichi; Haruo Okano, Tokyo; Michishige Aoyama, Suzuka; Masao Ito, Kitakami; Kei Hattori, Yokohama; Fumihiko Higuchi, Yokohama; Yoshifumi Tahara, Machida, all of Japan

[73] Assignee: Tokyo Electron Limited, Tokyo, Japan

[21] Appl. No.: 151,185

[22] Filed: Nov. 12, 1993

[30] Foreign Application Priority Data

Nov. 11, 1992 [JP] Japan .................. 4-301396

[51] Int. Cl.⁶ .............................. H01L 21/00
[52] U.S. Cl. .......................... 216/72; 134/1; 216/48; 216/47; 216/67; 216/77; 216/13
[58] Field of Search ............ 156/643, 646, 665, 664, 156/651; 134/1

[56] References Cited

U.S. PATENT DOCUMENTS

| | | | |
|---|---|---|---|
| 4,030,967 | 6/1977 | Ingrey et al. | 156/643 |
| 4,351,696 | 9/1982 | Radigan | 156/643 |
| 4,370,195 | 1/1983 | Halon et al. | 156/643 |
| 4,678,540 | 7/1987 | Uchimura | 156/643 |
| 5,259,923 | 11/1993 | Hori et al. | 156/643 |

FOREIGN PATENT DOCUMENTS

| | | |
|---|---|---|
| 427327 | 5/1991 | European Pat. Off. . |
| 56-3680 | 1/1981 | Japan . |
| 56-66040 | 6/1981 | Japan . |
| 56-137637 | 10/1981 | Japan . |
| 57-020450 | 2/1982 | Japan . |
| 61-258433 | 11/1986 | Japan . |
| 1-152646 | 6/1989 | Japan . |
| 3-104886 | 5/1991 | Japan . |
| 4-103130 | 4/1992 | Japan . |

*Primary Examiner*—R. Bruce Breneman
*Assistant Examiner*—George Goudreau
*Attorney, Agent, or Firm*—Oblon, Spivak, McClelland, Maier & Neustadt

[57] ABSTRACT

According to this invention, a dry etching method includes the step of sequentially forming an $SiO_2$ film, an Al—Si—Cu thin film, and a photoresist on an Si substrate to sequentially form a mask pattern, the step of etching the Al—Si—Cu thin film by RIE using a gas mixture of $Cl_2$ and $BCl_3$ as an etching gas, and the step of removing etching residues by a sputter effect obtained by the plasma of the $BCl_3$ gas.

22 Claims, 7 Drawing Sheets

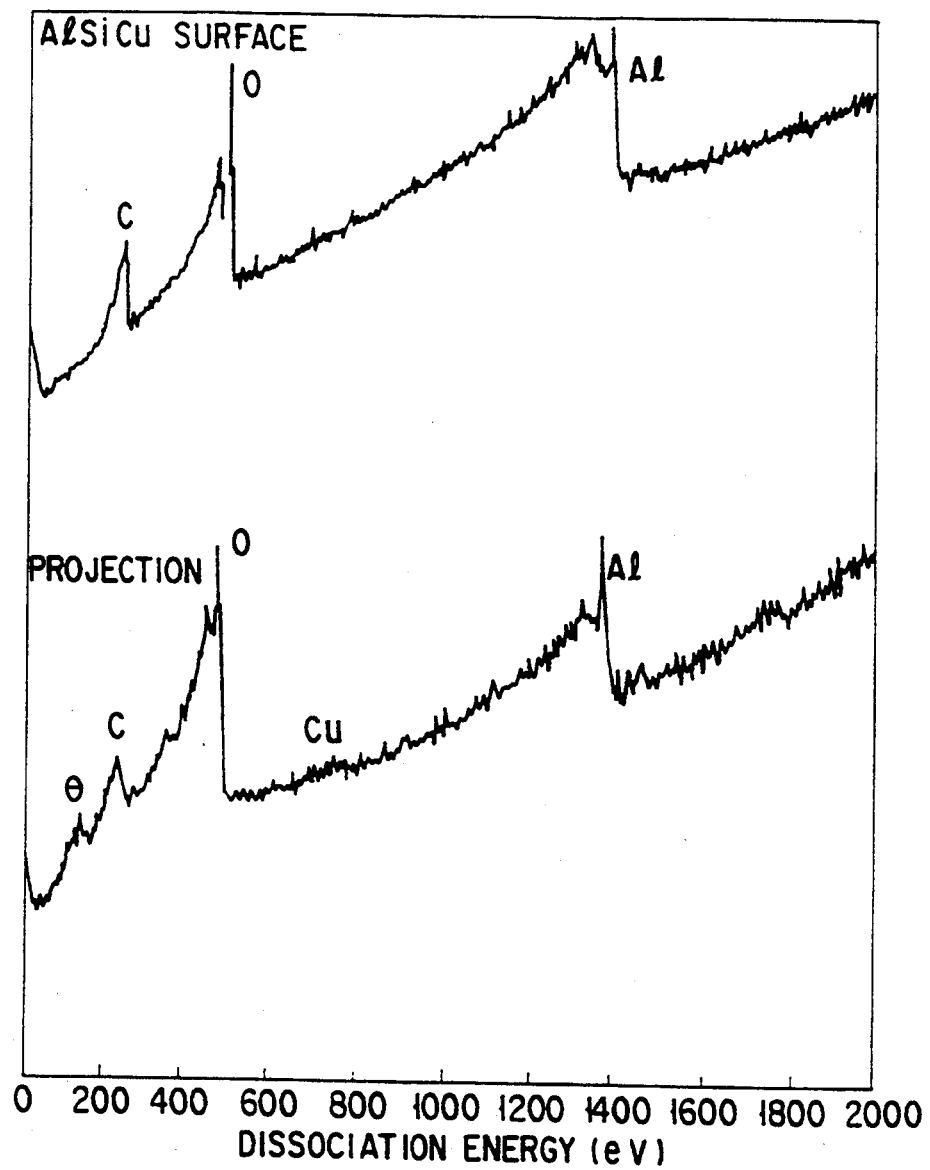
F I G. 4

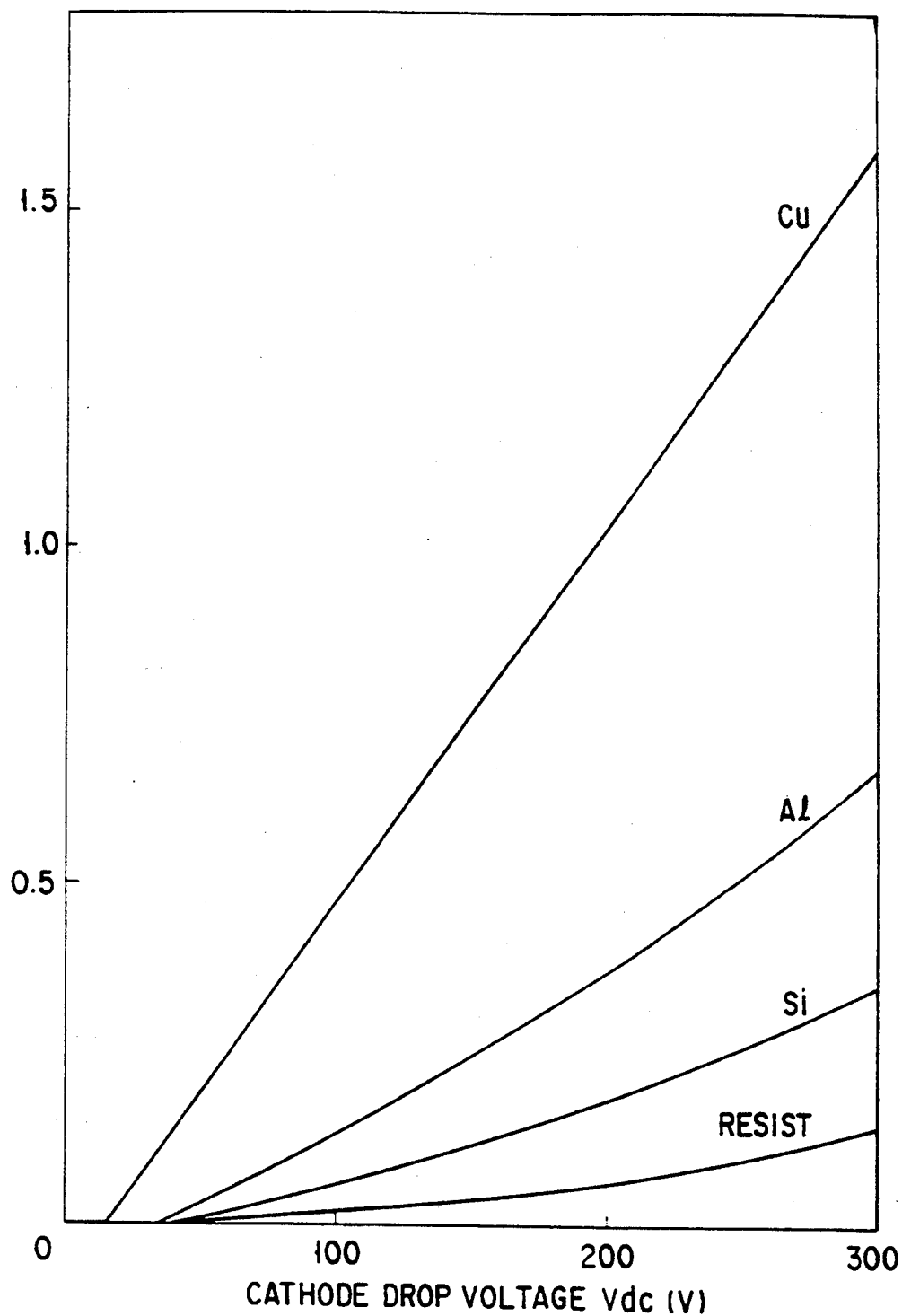
F I G. 5

DRY ETCHING METHOD

BACKGROUND OF THE INVENTION

1. Field of the Invention

The present invention relates to a dry etching method and, more particularly, to a method of dry-etching a film to be etched containing a plurality of materials having different etching rates.

2. Description of the Related Art

In recent years, a large-scale integrated circuit (LSI) formed by connecting a large number of transistors, resistors, and the like to constitute electrical circuits and integrating the electrical circuits on one chip is popularly used in an important portion of a computer or a communication machine. For this reason, the performance of the overall machine is largely dependent on the performance of each LSI.

The performance of each LSI can be improved by increasing the degree of integration, i.e., micropatterning an element. For this reason, a tendency toward further micropatterning of an element continues, and a highly precise pattern size is strongly demanded.

A semiconductor integrated circuit is generally formed by stacking an insulating thin film such as a silicon oxide thin film having a predetermined pattern, a conductive thin film of, e.g., aluminum, and the like on a semiconductor substrate such as a silicon substrate.

As techniques for processing these thin films in a predetermined pattern, the following techniques are conventionally used: a lithographic technique in which after a photosensitive photoresist is coated on a thin film, the photoresist is exposed in a desired pattern by a light or ultraviolet ray, and an exposed portion or an unexposed portion of the photoresist is selectively removed by developing, thereby forming a pattern in the photoresist; a dry etching technique for etching an underlying thin film using the photoresist pattern as a mask; and a peeling technique for removing the photoresist.

At the present, as one method of processing an underlying thin film in a desired pattern using a fine photoresist pattern, a reactive ion etching (RIE: Reactive Ion Etching) technique using a plasma is popularly used. According to this method, a substrate on which a film to be processed is deposited is loaded in a vacuum vessel having a pair of parallel-plate electrodes, the vacuum vessel is evacuated, and a reactive gas containing a halogen element or the like is supplied into the vacuum vessel. In addition, the reactive gas is transformed into a plasma by discharge obtained by applying RF power, and the film to be processed is etched by the generated plasma.

According to the method, since ions among various particles in the plasma are accelerated by a DC electric field generated by an ion sheath on the electrode surface, the ions having high energy collide against the film to be etched so as to cause an ion-accelerated chemical reaction. For this reason, etching progresses in the ion incident direction, and processing having excellent directivity and being free from an undercut can be achieved.

However, it has been found out that a method of this type has the following drawbacks.

At present, an Al alloy obtained by adding a small amount of Si or Cu to Al is used as the material of Al wiring layers. Cu in the Al alloy cannot be easily removed because the vapor pressure of a compound of Cu and a halogen serving as an etching gas is low, and after the Al thin film is etched, etching residues are formed due to the presence of Cu. These etching residues degrade the insulating property between wiring layers, and pose a problem such as corrosion, thereby remarkably degrading reliability of the wiring layers.

Although formation of the etching residues can be suppressed by increasing ion energy in the plasma etching, in this case, the etching selection ratio with respect to the resist ((etching rate of Al thin film)/(etching rate of photoresist)) is considerably low, and patterning at a high precision cannot be performed.

In order to solve this problem, the following method is used. That is, in etching an Al thin film, a multilayered resist is formed on the Al thin film, a pattern having a high aspect ratio is formed on the multilayered resist, and the Al thin film is etched using the pattern as a mask.

For example, when a three-layered resist process is to be used, after an Al film serving as a film to be processed is deposited on a substrate, an organic thin film is coated as a lower layer so as to flatten the substrate surface. After an inorganic film such as a silicon oxide film is deposited as an intermediate layer, a photoresist is coated as an upper layer, and the upper photoresist is formed into a pattern by a normal photolithographic technique.

After the three-layered resist is formed as described above, the intermediate layer is etched using the upper photoresist pattern as a mask by anisotropic etching such as RIE using a gas containing a halogen as an etching gas, and the organic thin film serving as the lower layer is etched using a gas containing oxygen, thereby transferring the upper photoresist pattern to the two lower thin films.

However, the method of etching an Al film using a multilayered resist generally has complicated processes, and poses a problem of high cost. In addition, since this etching has a high aspect ratio, a microloading effect occurs when the Al film serving as a film to be processed is etched, and problems such as a high dependency of the etching rate on the pattern line width are posed.

In addition, the method of etching an Al film using a multilayered resist poses the following problems.

In a normal mask peeling process, although a photoresist is dissolved using an aqueous sulfuric acid solution or an aqueous hydrogen peroxide solution or removed by a plasma ashing method using an oxygen gas in accordance with the material of the underlying layer, only an organic thin film can be removed by this mask peeling process. Since the mask formed by the multilayered resist includes an inorganic thin film such as a silicon oxide film or the like, the mask is an inorganic mask. For this reason, the mask formed using the multilayered resist cannot be removed by the normal mask peeling means described above. Although an inorganic mask can be removed using a gas or the like containing a halogen such as fluorine or chlorine, in this case, a silicon oxide film, silicon layer, Al layer, and the like of a target substrate serving as underlying layers are also damaged.

That is, when a thin film is etched using a conventional RIE technique, in particular, when an Al thin film containing a small amount of Cu or the like is etched to form wiring layers, etching residues are formed due to the presence of Cu or the like, and reliability of the wiring layers is degraded. Although formation of the etching residues can be suppressed by high ion energy or the use of a multilayered resist, in this case, the following new problems are posed. That is, the etching selection ratio with respect to the resist is lowered, the processes are complicated, and the cost increases.

SUMMARY OF THE INVENTION

The present invention has been made in consideration of the above circumstances, and has as its object to provide a dry etching method in which, even when a film to be etched containing a plurality of materials having different etching rates is used, formation of etching residues can be suppressed without causing problems such as a decrease in etching selection ratio with respect to the resist, complicating of processes, and an increase in cost.

According to the first aspect of the present invention, there is provided a dry etching method comprising the first step of forming a mask pattern on a film to be etched containing a plurality of materials having different etching rates, the second step of setting an etching gas in a plasma state and anisotropically etching the film to be etched mainly by a chemical action of a plasma of the etching gas using the mask pattern as a mask, and the third step of setting a gas having a sputter effect in a plasma state and sputter-removing a surface of the film to be etched by a plasma of the gas.

According to the second aspect of the present invention, there is provided a dry etching method comprising the first step of forming a mask pattern on a film to be etched containing, as a main component, an Al alloy containing at least one of Cu and Si, the second step of setting an etching gas in a plasma state and anisotropically etching the film to be etched mainly by a chemical action of a plasma of the etching gas using the mask pattern as a mask, and the third step of setting a gas having a sputter effect in a plasma state and sputter-removing a surface of the film to be etched by a plasma of the gas.

According to the third aspect of the present invention, there is provided a dry etching method comprising the first step of forming a mask pattern on a film to be etched containing, as a main component, an Al alloy containing at least one of Cu and Si, the second step of setting an etching gas containing at least one of Cl and Br in a plasma state and anisotropically etching the film to be etched mainly by a chemical action of a plasma of the etching gas using the mask pattern as a mask, and the third step of setting a gas having a sputter effect in a plasma state and sputter-removing a surface of the film to be etched by the plasma of the gas.

BRIEF DESCRIPTION OF THE DRAWINGS

FIG. 4 is a graph showing a result obtained in a composition analysis of a projection and the surface of an Al—Si—Cu thin film using Auger electron spectroscopy;

FIG. 5 is a graph showing the relationship between the etching rates of different materials and the cathode drop voltage;

DETAILED DESCRIPTION OF THE PREFERRED EMBODIMENTS

Figure 1A:
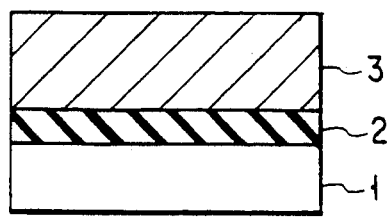
FIGS. 1A to 1G are views showing the manufacturing steps in a dry etching method according to an embodiment of the present invention.

When an Al—Si—Cu film was to be etched by reactive ion etching using, as an etching gas, a gas containing at least one of chlorine and bromine as a main component and using a photoresist pattern formed on the Al—Si—Cu film as a mask, the present inventors tried various processes for removing etching residues. As a result, they found out the following fact.

That is, it was found out that projections (projecting portions) serving as the cores of etching residues on the etched surface and formed when the Al—Si—Cu film was etched by a predetermined amount (e.g., 50% of the film thickness) using the reactive ion etching could be selectively sputter-etched using plasma etching (to be also referred to as plasma processing hereinafter) using a gas such as a $BCl_3$ gas having a sputter effect without increasing the amount of decrease in photoresist pattern thickness and the AlSiCu film. In addition, the amount of decrease in photoresist pattern thickness was small upon completion of the etching, and an excellent etch profile could be obtained.

On the basis of this finding, according to the present invention, there is provided a dry etching method comprising the step of forming, when a film to be etched containing a plurality of materials having different etching rates are to be etched, a mask pattern on the film to be etched, the step of setting an etching gas in a plasma state and anisotropically etching the film to be etched mainly by a chemical action of the plasma of the etching gas using the mask pattern as a mask, and the step of setting a gas having a sputter effect in a plasma state and sputter-removing the surface of the film to be etched by the plasma of the gas. In this manner, projections serving as the nuclei of etching residues can be sputter-removed without causing a problem such as an increase in decrease amount of the film thickness to be etched. Therefore, highly precise patterning can be performed, and highly reliable wiring layers can be formed.

As the result of further experiments, the following result was found out. That is, etching residues could be removed more effectively when $BCl_3$ plasma processing was performed while an Al—Si—Cu film was etched than when etching residues formed by fully etching or over-etching an Al—Si—Cu film were subjected to $BCl_3$ plasma processing or the like. That is, it was found out that plasma processing using a gas such as $BCl_3$ having a sputter effect was effectively performed while an etching film to be etched was etched. Therefore, when the process of etching a film to be etched by reactive ion etching using an etching gas and the process of performing plasma processing using a gas having a sputter effect are alternately repeated to pattern a film to be etched such as an Al—Si—Cu film, degradation in etch profile or degree of formation of etching residues can be further reduced. In addition, the etching selection ratio of the film to be etched with respect to the photoresist can be further increased.

As a film to be etched to which the present invention is applied and which contains a plurality of materials having different etching rates, Al alloy, WSi, or a polysilicon film or the like having a surface on which an oxide film is formed is used. In addition, the present invention is suitable for etching of an Al-alloy film used in Al wiring layers, and, more particularly, suitable for etching of an Al-alloy film (e.g., the Al—Si—Cu film described above) containing at least one of Cu and Si and causing an etching residue problem. An aluminum alloy containing 96% or more of aluminum and a small amount of Mg, Pd, Ti, Sr, Ni, Ta, or the like, in place of or in addition to Cu and Si can be used. In addition, a stacked film such as an AlSiCu/TiN/Ti film constituted by an AlSiCu thin film and a barrier metal film may be used. When an Al—Si—Cu film is used, the concentration of these elements preferably falls within a range of 0.01 wt % to 2.0 wt %. The thickness of a film to be etched preferably falls within a range of 100 to 1,000 nm, more preferably 200 to 800 nm.

An oxide film serving as a barrier film is preferably formed under the film to be etched.

A mask pattern is formed on such a film to be etched. Although a resist film is used when a mask pattern is formed, the material of the resist film is not particularly limited, and a material generally used in this field can be used as the material of the resist film. In this case, the thickness of the resist film preferably falls within a range of 0.1 to 2.0 $\mu$m, and more preferably falls within a range of 0.5 to 1.5 $\mu$m.

After the mask pattern is formed, reactive ion etching mainly using a chemical reaction by the plasma of an etching gas is performed. The etching gas used in this case is not particularly limited, and although an appropriate gas is used depending on the film to be etched, a gas containing at least one of chlorine and bromine is preferably used. $Cl_2$, $BCl_3$, HCl, or the like is used as the gas containing chlorine, and HBr, $Br_2$, BBr, or the like is used as the gas containing bromine. In particular, a gas mixture of $Cl_2$ and $BCl_3$ or a gas mixture of $Cl_2$ and HBr is preferably used. A gas obtained by adding a small amount of a fluorine-containing gas such as $CF_4$, $CHF_3$, $NF_3$, or $SF_6$ to one of these gases may be used. In addition, a gas obtained by adding a rare gas such as Ar, Kr, Xe, He, or Ne or a gas such as $H_2$, HCl or $B_2H_6$ to at least one of these gases may be used. When the gases as described above are used, the film to be etched can be etched at a high etching rate and a high degree of anisotropy.

Note that the surface of the film to be etched is preferably sputter-removed prior to the above etching process.

Upon completion of the etching process, in order to remove etching residues, a gas having a sputter effect is set in a plasma state, and the surface of the film to be etched is sputter-removed using the plasma of the gas. Although any gas having a sputter effect can be used as the gas having a sputter effect used in this case, $BCl_3$ or $BBr_3$ is preferably used. In addition, a gas mixture obtained by mixing a compound of boron and a halogen such as $B_2Cl_4$ or $B_2Br_4$ with the gas such as $BCl_3$ or $BBr_3$ or a gas mixture obtained by adding a rare gas such as Ar, Kr, Xe, He, or Ne or a gas such as $H_2$, HCl, or $B_2H_6$ to the gas such as $BCl_3$ or $BBr_3$ can be used. Also, a rare gas may be singly used. The process of sputter-removing the surface of the film to be etched is preferably performed such that the sputtering time is controlled in accordance with the amount of etching residues.

The etching process and the process of sputter-removing the film to be etched are preferably repeated a plurality of number of times as described above. Then, the etching residues can be effectively removed. Although the number of times of repetition is appropriately set in accordance with the thickness or material of the film to be etched, the number of times of repetition is preferably set to be 3 to 5. In this case, the taper angle of etching can be controlled by controlling the sputtering time. That is, when the etching and sputtering processes are repeated, as the sputtering time is longer, a normal tapered film suitable for micropatterning of a pattern is formed, and formation of cavities can be suppressed.

The pressure, the RF power density, the substrate temperature, the etching time, and the like set in the process of etching a film to be etched and in the process of sputtering etching residues are not particularly limited to specific values, and they are appropriately set.

Embodiments of the present invention will be described below with reference to the accompanying drawings.

FIGS. 1A to 1G are views for explaining the steps of a dry etching method according to the first embodiment of the present invention.

As shown in FIG. 1A, after an $SiO_2$ film 2 was formed on an Si substrate 1, an Al—Si—Cu thin film 3 having a thickness of 800 nm was deposited on the $SiO_2$ film 2. Note that the Si concentration and Cu concentration of the Al—Si—Cu thin film 3 are 1 wt % and 0.5 wt %, respectively.

Figure 1B:
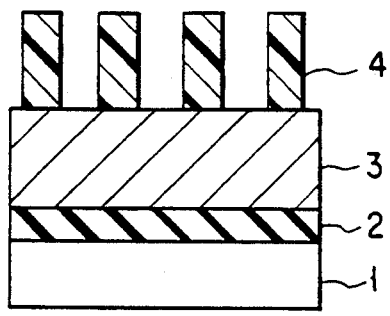

As shown in FIG. 1B, a photoresist 4 having a thickness of 1.3 $\mu$m was coated on the Al—Si—Cu thin film 3. An organic photoresist generally used in this field was used as the photoresist 4. The photoresist 4 was exposed using a normal photolithographic technique, and the photoresist 4 was developed to form a photoresist pattern 4.

Figure 1C:
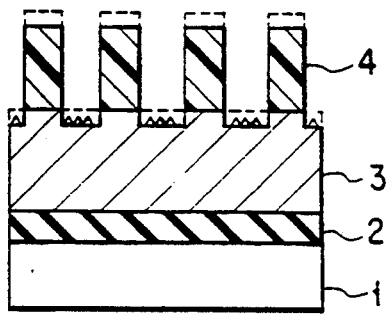

Thereafter, as shown in FIG. 1C, the Al—Si—Cu thin film 3 was etched using the photoresist pattern 4 as a mask.

Figure 2:
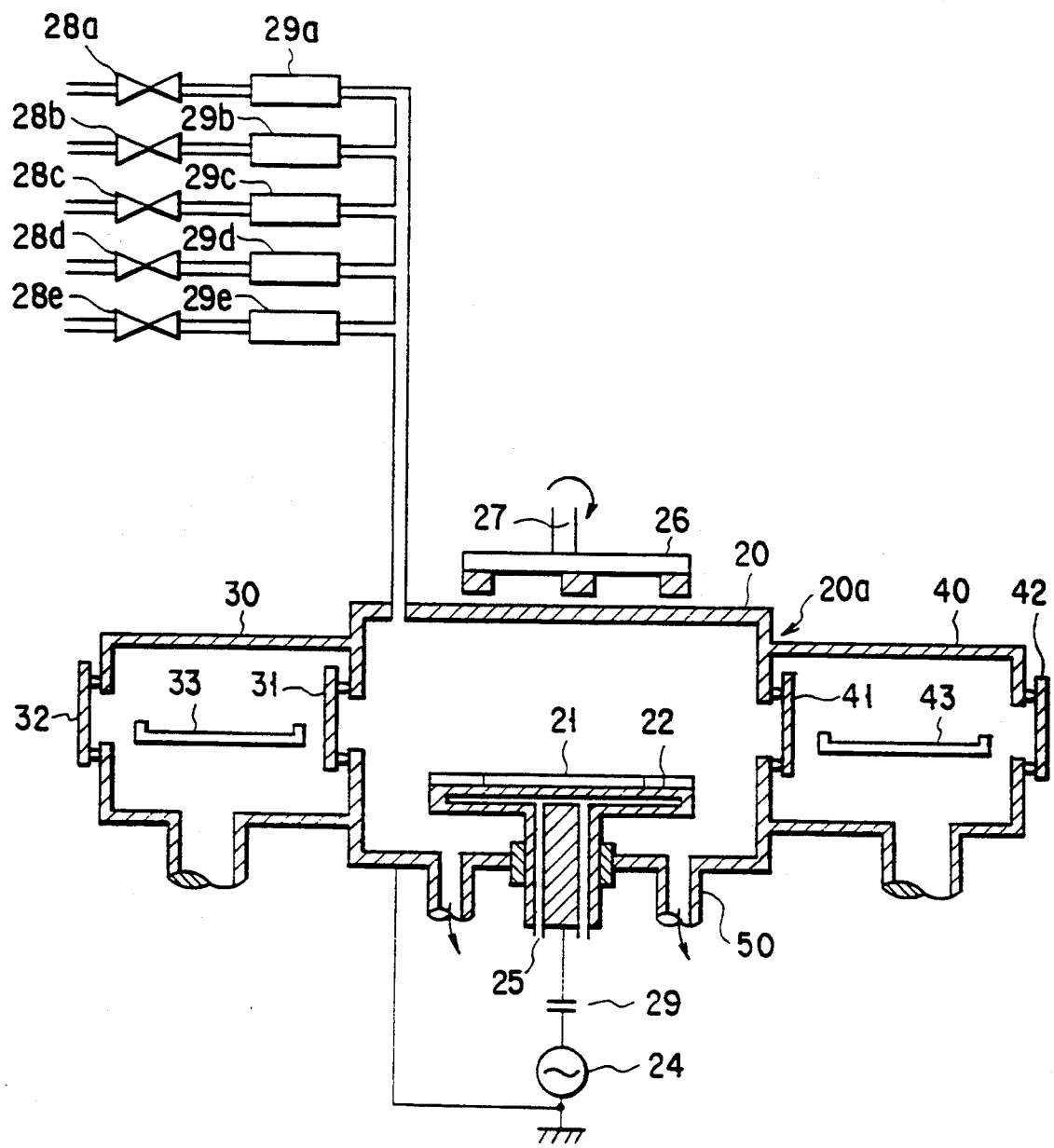
FIG. 2 is a schematic view showing the arrangement of a dry etching apparatus used in etching processing in the embodiment of the present invention.

In this etching, a dry etching (RIE) apparatus shown in FIG. 2 is used.

This dry etching apparatus is mainly constituted by an etching unit 20, a loading preliminary chamber 30, and an unloading preliminary chamber 40.

The etching unit 20 comprises a vacuum vessel 20a, an electrode 22, arranged in the vacuum vessel 20a, for placing a target substrate 21, an RF power supply 24 connected to the electrode 22 through a blocking capacitor 29 to apply RF power of 13.56 MHz to the electrode 22, and a cooling tube 25 for cooling the electrode 22 to control the substrate temperature of the target substrate 21 to a desired temperature.

While $Cl_2$, $BCl_3$, HBr, $O_2$, He (or Ar or Kr) are supplied from a $Cl_2$ gas supply line 28a, a $BCl_3$ gas supply line 28b, an HBr gas supply line 28c, an $O_2$ gas supply line 28d, and an inert gas supply line 28e into the vacuum vessel 20a, respectively, an RF voltage is applied across the first electrode 22 and the upper wall of the vacuum vessel 20a also serving as the second electrode.

In this case, the vacuum vessel 20a is grounded. The gas supply lines 28a to 28e comprise flow-rate controllers 29a to 29e, respectively, so that the flow rates of these gas supply lines can be controlled to desired values. In addition, the pressure in the vacuum vessel 20a can be controlled to a predetermined value by an exhaust system (not shown) through an exhaust port 50.

A permanent magnet 26 is arranged above the second electrode portion of the vacuum vessel 20a, and the permanent magnet 26 is eccentrically rotated about a rotating shaft 27 by a motor. A highly dense plasma can be generated and maintained in a high degree of vacuum of about $10^{-3}$ Torr or less by a magnetic field of 100 to 500 gauss generated by the permanent magnet 26. A large number of ions are extracted from the highly dense plasma generated as described above, and are radiated on the target substrate 21 to etch the target substrate 21.

The vacuum vessel 20a of the etching unit 20, the loading preliminary chamber 30, and the unloading preliminary chamber 40 of the etching unit 20 are partitioned by gate valves 31 and 41, respectively. While the vacuum vessel 20a is kept at the set vacuum, a gate valve 32 arranged on the loading preliminary chamber 30 is opened to load a target object into the loading preliminary chamber 30, or a gate valve 42 arranged on the unloading preliminary chamber 40 is opened to unload a target object from the unloading preliminary chamber 40. In this manner, the target object can be prevented from being adversely affected by moisture or oxygen in the atmospheric air.

Substrate mounting tables 33 and 43 are arranged in the loading preliminary chamber 30 and the unloading preliminary chamber 40, respectively.

In the process of etching the Al—Si—Cu thin film 3 shown in FIG. 1C using the above apparatus, etching (RIE) of the thin film 3 of the thickness of 150 nm was performed. Note that, in this RIE, the substrate temperature was set to be 50° C., a gas mixture (pressure: 3.5 Pa) of $Cl_2$ (flow rate: 60 SCCM) and $BCl_3$ (flow rate: 76 SCCM) was used as an etching gas, and RF power was set to be 150 W.

Figure 3:
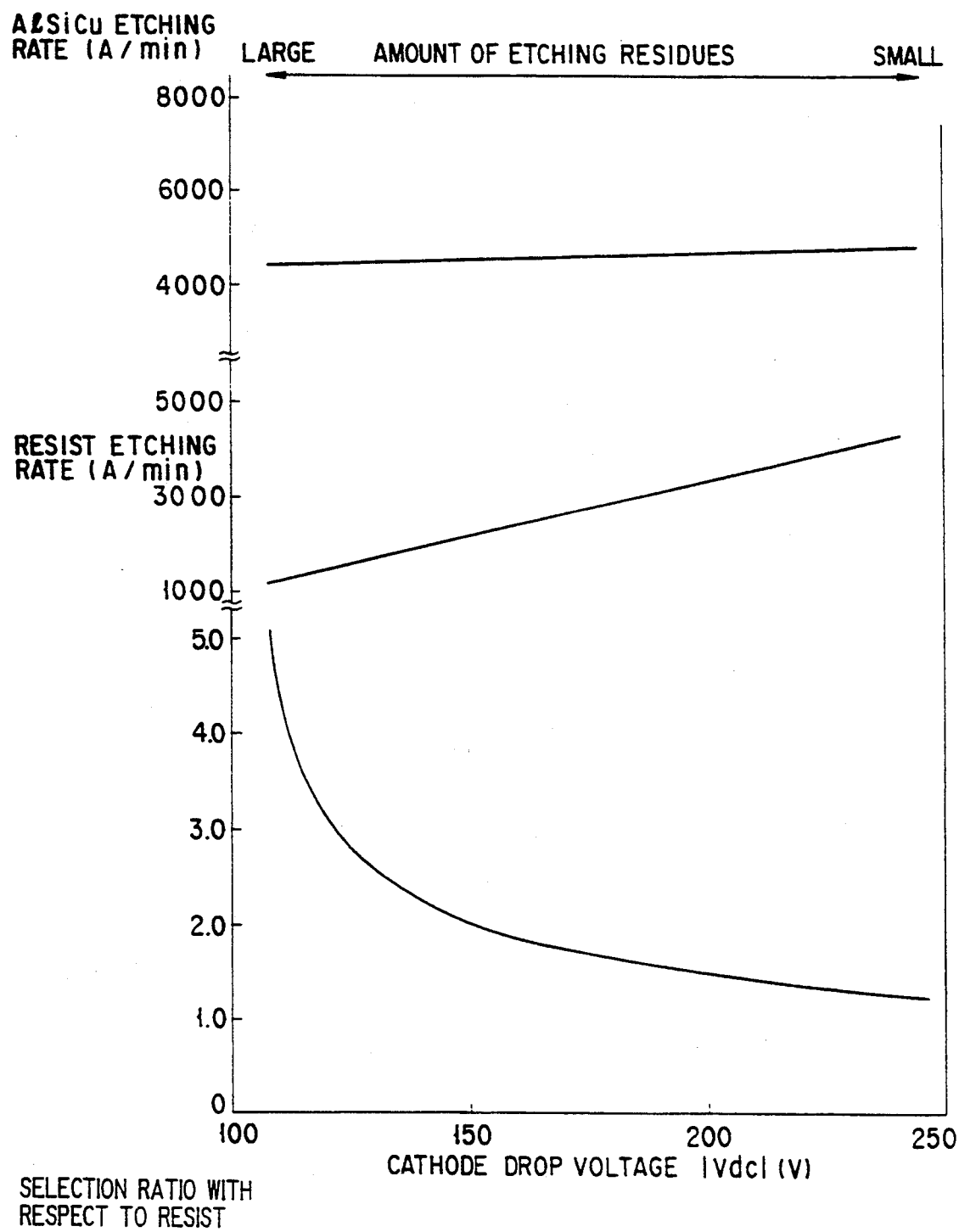
FIG. 3 is a graph showing the relationships between the cathode drop voltage, the etching rate of a photoresist pattern, the etching selectivity ratio with respect to the resist, and the amount of etching residues.

These etching conditions are set to make obtain a vertical etch profile of the Al—Si—Cu thin film 3. FIG. 3 is a view for explaining these conditions and shows the relationships between the cathode drop voltage ($|V_{dc}|$) obtained when RIE for the Al—Si—Cu thin film 3 is performed while the RF power is changed within a range of 0.5 to 3.0 W/cm$^2$ in the step shown in FIG. 1C, the etching rate of the Al—Si—Cu thin film 3 (Al—Si—Cu etching rate), the etching rate of the photoresist pattern 4 (resist etching rate), the etching selectivity ratio with respect to the resist (Al—Si—Cu etching rate/resist etching rate), and the amount of etching residues.

As is apparent from FIG. 3, although the etching rate of the Al—Si—Cu thin film 3 does not largely change even when the cathode fall voltage ($|V_{dc}|$) increases, the etching rate of the photoresist pattern 4 increases with an increase in cathode fall voltage ($|V_{dc}|$). In addition, when the amount of etching residues was estimated by observation using an optical microscope after the RIE for the Al—Si—Cu thin film 3 was performed, as shown in FIG. 3, it was found that the amount of etching residues decreased with a decrease in cathode fall voltage ($|V_{dc}|$). However, it was found out that the etching residues could not be completely removed when the etching selection ratio with respect to the resist was 2 or more. In addition, when the etch profile of the Al—Si—Cu thin film 3 was estimated by an SEM, it was found out that the tapered shape was increased in size (taper angle was decreased) by etch back of the photoresist pattern 4 with an increase in the cathode fall voltage ($|V_{dc}|$).

Therefore, after the RF power was set to be 150 W to fix the cathode fall voltage ($|V_{dc}|$) to about 120 v, and other conditions were set to be the same as those described above, RIE for the Al—Si—Cu thin film 3 was performed. In this case, the Al—Si—Cu thin film 3 was etched at an etching rate of 450 nm/min, and the photoresist pattern 4 was etched at an etching rate of 150 nm/min. That is, the etching was performed such that the etching selection ratio with respect to the resist was set to be 3.0. When the etch profile of the Al—Si—Cu thin film 3 at this time was estimated by an SEM, it was found out that the etch profile was almost vertical. However, when etching residues were estimated by an SEM, a large number of columnar etching residues each having a height of 100 nm were observed.

As described above, when the etching conditions are controlled, the Al—Si—Cu thin film 3 can be almost vertically etched such that the etching selection ratio with respect to the resist is set to be 3.0. However, etching residues are left on the etched surface of the Al—Si—Cu thin film 3. When the etched surface of the Al—Si—Cu thin film 3 obtained upon completion of the etching process shown in FIG. 1C was observed by an SEM, projections (projecting portions) each having a height of about 10 nm were detected. In addition, when the composition of each projection was analyzed by Auger electron spectroscopy (AES), the result shown in FIG. 4 was obtained. That is, although the Cu concentration of the projection was high, the Cu concentration of a portion on the surface of the Al—Si—Cu thin film 3 where no projection was formed was low, and the projection contains Cu as a main component.

Figure 1D:
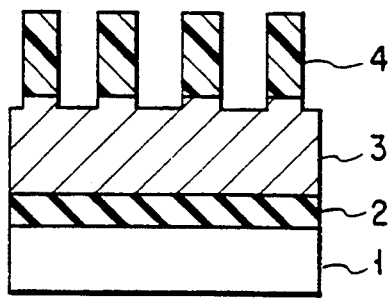

Subsequently, as shown in FIG. 1D, the surface of the Al—Si—Cu thin film 3 was subjected to sputter processing by a $BCl_3$ plasma for 10 seconds. In this processing, the flow rate of $BCl_3$ was set to be 50 SCCM, the substrate temperature was set to be 50° C., and RF power was set to be 300 W.

When the etched surface of the Al—Si—Cu thin film 3 which was subjected to the $BCl_3$ plasma processing described above was observed by an SEM, it was found out that the projections were sputter-removed.

Figure 1E:
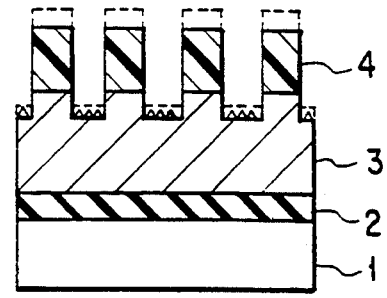

Then, as shown in FIG. 1E, the Al—Si—Cu thin film 3 was etched to a depth of 150 nm under the same conditions as those of the etching step shown in FIG. 1C.

Figure 1F:
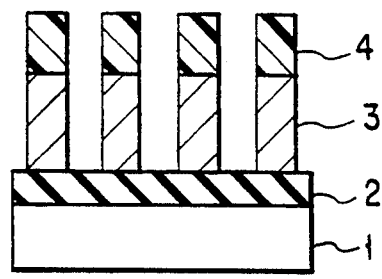

The etching and the plasma processing shown in FIG. 1D were alternately repeated five times, and as shown in FIG. 1F, the Al—Si—Cu thin film 3 was completely patterned until the underlying $SiO_2$ film 2 was exposed.

In this case, when the surface of the $SiO_2$ film 2 and the etch profile of the Al—Si—Cu thin film 3 were observed by an SEM, no etching residues were detected, and the etch profile of the Al—Si—Cu thin film 3 was almost vertical. In addition, the etching selection ratio with respect to the resist obtained from the remaining amount of the photoresist pattern 4 was about 2.7.

In this manner, it was confirmed that, when the $BCl_3$ plasma processing was used, the Al—Si—Cu thin film 3 could be etched without decreasing the etching selection ratio with respect to the resist, degrading the etch profile, and forming etching residues.

After the patterning was completely performed as described above, as shown in FIG. 1G, the photoresist pattern 4 was removed. This process completes the etching of the Al—Si—Cu thin film 3. In this case, it was found out that the photoresist pattern 4 was easily removed by ashing using a barrel type plasma etching apparatus. In addition, when the Al—Si—Cu thin film 3 after the photoresist pattern 4 was removed was observed by an SEM, it was confirmed that an excellent AlSiCu thin film pattern having an almost vertical shape and line/space widths of 400 nm/400 nm was formed.

In order to clarify a mechanism of removing etching residues formed by $BCl_3$ plasma processing, the relationship between the etching rates of different films to be etched (Cu film, Al film, Si film, and a photoresist film) by the $BCl_3$ plasma etching and the cathode fall voltage was examined. Note that the substrate temperature is 50° C., and the pressure of the $BCl_3$ gas is 3.5 Pa. A photoresist TSMR-CRB (tradename) was used as the photoresist film.

FIG. 5 shows the result of this examination. As is apparent from FIG. 5, the etching rate of the Cu film by the $BCl_3$ plasma is considerably higher than each of the etching rates of the Si film, the Al film, and the photoresist film.

Table 1 shows sputtering amounts of the Cu film, Al film, Si film, and photoresist film obtained by Ar ions of 1 $mA/cm^2$ at an acceleration voltage of 500 eV.

TABLE 1

| Material | Etching Rate (nm/min) |
| --- | --- |
| Cu | 82 |
| Al | 63 |
| Si | 31 |
| Resist | 23 |

When Table 1 is compared with FIG. 5, it is understood that the etching rates obtained by a $BCl_3$ plasma and sputtering amounts obtained by Ar ions coincide with each other well.

According to the above results, it is considered that, when $BCl_3$ plasma processing is performed, Cu is removed selectively with respect to the Al—Si—Cu thin film 3 and the photoresist pattern 4 by the sputter effect of the $BCl_3$ plasma. For this reason, since ion energy need not be increased unlike the prior art, the etching selectivity ratio with respect to the resist is not decreased. In addition, unlike a case of using a multilayered resist, the processes are not complicated, and the cost is not increased.

Since oxides of Cu, Al, and Si have resistances to sputter higher than those of Cu, Al, and Si, respectively, sputter etching by Ar ions or the like is difficult to perform when the Al—Si—Cu film surface is oxidized. However, when a $BCl_3$ plasma is used, since B decomposed in the $BCl_3$ plasma has good reduction property, sputter etching progresses while the oxide is reduced by the B. Therefore, according to this embodiment, even when the surface of the Al—Si—Cu thin film 3 is oxidized by oxygen or water produced from the photoresist pattern 4 during etching of the Al—Si—Cu thin film 3 so as to form oxides of Cu, Al, and Si, these oxides can be easily removed.

In this manner, according to this embodiment, in etching the Al—Si—Cu thin film 3 containing Cu which is a material having a low volatility in a halogen gas, when plasma etching processing using a $BCl_3$ gas is intermittently performed, etching having a high etching selection ratio with respect to the resist and being free from etching residues can be achieved. In this manner, the Al—Si—Cu thin film 3 can be etched at a high precision, and, therefore, highly reliable wiring layers and the like formed of Al—Si—Cu can be obtained.

Note that, prior to the etching processing shown in FIG. 1C, the Al—Si—Cu film may be subjected to $BCl_3$ plasma processing. A natural oxide film formed on the surface of the Al—Si—Cu thin film 3 can be removed by the $BCl_3$ plasma processing.

The second embodiment of the present invention will be described below.

In this embodiment, etching processing was performed in the same manner as that of the first embodiment except that a gas mixture of HBr and $Cl_2$ was used as an etching gas in place of the gas mixture of $BCl_3$ and $Cl_2$ in the first embodiment, and $BBr_3$ was used as a gas having a sputter effect in place of $BCl_3$. For this reason, since the basic processes are the same as those of the first embodiment, the second embodiment will be described below with reference to FIGS. 1A to 1G.

As shown in FIG. 1A, an $SiO_2$ film 2 was formed on an Si substrate 1, and an Al—Si—Cu thin film (Si concentration: 1 wt % and Cu concentration: 0.5 wt %) 3 having a thickness of 800 nm was deposited on the $SiO_2$ film 2.

Then, as shown in FIG. 1B, after a photoresist 4 having a thickness of 1.3 μm was coated on the Al—Si—Cu thin film 3, the photoresist 4 was exposed using a normal lithographic technique, and the photoresist 4 was developed to form a photoresist pattern 4.

Subsequently, by using the dry etching apparatus shown in FIG. 2 and a gas mixture (pressure: 2.0 Pa) of HBr (flow rate: 50 SCCM) and $Cl_2$ (flow rate: 50 SCCM) as an etching gas, as shown in FIG. 1C, the Al—Si—Cu thin film 3 was etched to a depth of 150 nm using the photoresist pattern 4 as a mask under the conditions of a substrate temperature of 50° C. and RF power of the 0.8 $W/cm^2$.

At this time, the etching rate of the Al—Si—Cu thin film 3 was 500 nm/min, the etching rate of the photoresist pattern 4 was 100 nm/min, and the etching selection ratio with respect to the photoresist pattern was 5.0.

When the surface of the Al—Si—Cu thin film 3 which was subjected to the above etching was observed, projections each having a height of about 20 nm were detected.

Thereafter, as shown in FIG. 1D, the Al—Si—Cu thin film 3 was subjected to $BBr_3$ plasma processing for 10 seconds under the conditions of a pressure of 3.5 Pa, RF power of 300 W, a substrate temperature of 50° C., and a $BBr_3$ flow rate of 50 SCCM. When the surface of the Al—Si—Cu thin film 3 which was subjected to the $BBr_3$ plasma processing was observed, the projections were completely etched.

Next, as shown in FIG. 1E, under the same conditions as in FIG. 1C, the Al—Si—Cu thin film 3 was etched to a depth of 150 nm. In addition, the same $BBr_3$ plasma processing as in FIG. 1D was performed for 10 seconds.

The etching and $BBr_3$ plasma processing were alternately repeated five times, and, as shown in FIG. 1F, the Al—Si—Cu thin film 3 was completely patterned until the surface of the underlying $SiO_2$ film 2 was exposed. When the surface of the $SiO_2$ film 2 and the etch profile obtained after the Al—Si—Cu thin film 3 was patterned were observed by an SEM, no residues were detected. In addition, the Al—Si—Cu thin film 3 was almost vertically etched, and the etching selectivity ratio with respect to the photoresist obtained by the remaining amount of the photoresist pattern 4 was about 5.

Figure 1G:
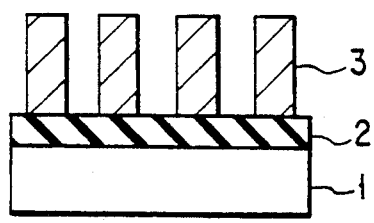

Finally, as shown in FIG. 1G, the photoresist pattern 4 was removed using an ashing apparatus using a gas containing oxygen as a main component, thereby completing the etching processing of the Al—Si—Cu thin film 3. After the photoresist pattern 4 was removed as described above, when the pattern of the Al—Si—Cu thin film 3 was estimated by an SEM, it was confirmed that an excellent AlSiCu thin film pattern having a vertical shape and line/space widths of 400 nm/400 nm was formed.

According to this embodiment, when plasma etching processing using the $BBr_3$ gas was intermittently performed, a high etching selection ratio with respect to the photoresist could be obtained, and etching free from an etching residues could be performed. Therefore, it was confirmed that the Al—Si—Cu thin film 3 could be etched at a high precision.

The $BBr_3$ plasma processing may be performed before the first etching to obtain the same object as that of the first embodiment.

The third embodiment of the present invention will be described below.

Since the basic processes in this embodiment are the same as those of the first embodiment, the third embodiment will be described with reference to FIGS. 1A to 1G as in the first embodiment.

As in the first embodiment, as shown in FIG. 1A, an $SiO_2$ film 2, an Al—Si—Cu thin film (Si concentration: 1 wt % and Cu concentration: 0.5 wt %) 3 having a thickness of 800 nm, and a photoresist 4 were sequentially formed on an Si substrate 1.

Then, as shown in FIG. 1B, the photoresist 4 was exposed using a normal lithographic technique, and the photoresist 4 was developed to form a photoresist pattern 4.

Subsequently, by using the dry etching apparatus shown in FIG. 2 and a gas mixture (pressure: 6 Pa) of $Cl_2$ (flow rate: 60 SCCM) and $BCl_3$ (flow rate: 76 SCCM) as an etching gas, as shown in FIG. 1C, the Al—Si—Cu thin film 3 was etched to a depth of 150 nm using the photoresist pattern 4 as a mask under the conditions of a substrate temperature of $30 \times C$. and RF power of the 0.8 $W/cm^2$.

At this time, the etching rate of the Al—Si—Cu thin film 3 was 600 nm/min, the etching rate of the photoresist pattern 4 was 170 nm/min, and the etching selection ratio with respect to the photoresist pattern was 3.5.

When the surface of the Al—Si—Cu thin film 3 which was subjected to the above etching was observed, although the etch profile was almost vertical, a large number of columnar etching residues were formed.

The flow rate ratio of $BCl_3/Cl_2$, RF power, the pressure, and the like were changed, and plasma processing using a gas mixture of $BCl_3$ and $Cl_2$ was performed as shown in FIG. 1D. This etching and the plasma processing using the gas mixture of $BCl_3$ and $Cl_2$ were repeated several times so as to completely pattern the Al—Si—Cu thin film 3 as shown in FIG. 1F. More specifically, for example, after the etching process in FIG. 1C, the plasma processing was performed for 5 seconds under the conditions of a $BCl_3/Cl_2$ flow rate ratio of 60/60 SCCM, a pressure of 2.0 Pa, and an RF power density of 0.8 $W/cm^2$, and this process and the process in FIG. 1C were alternately repeated a total of four times to completely pattern the Al—Si—Cu thin film 3 as shown in FIG. 1F. According to this method, since the Al—Si—Cu thin film 3 was etched by a $Cl_2$ plasma during the $BCl_3$ plasma processing, the time for patterning the Al—Si—Cu thin film 3 could be shortened.

When a state of etching residues, the shape of the Al—Si—Cu thin film 3, and the etching selection ratio with respect to the resist obtained after the above processes were performed were estimated, no etching residue was observed, the etch profile was almost vertical, and the etching selection ratio with respect to the resist was about 3.1. It was found out that this effect could be obtained when the mixing ratio of $BCl_3/Cl_2$ was 50% or more. Note that the selection ratio with respect to the photoresist was obtained from the remaining amount of the photoresist pattern 4.

Finally, as shown in FIG. 1G, the photoresist pattern 4 was removed, thereby completing the etching processing of the Al—Si—Cu thin film 3. Note that the photoresist pattern 4 can be easily removed by ashing using a normal barrel type plasma etching apparatus.

After the photoresist pattern 4 was removed, when the pattern of the Al—Si—Cu thin film 3 was estimated by an SEM, it was confirmed that an excellent Al—Si—Cu thin film pattern having a vertical shape and line/space widths of 400 nm/400 nm was formed.

In this manner, according to this embodiment, the same effect as described in the above described embodiments was obtained. In addition, according to this embodiment, since the Al—Si—Cu thin film 3 was etched by a $Cl_2$ plasma during the $BCl_3$ plasma processing, the time for etching the Al—Si—Cu thin film 3 was shorter than that in each of the two embodiments described above.

In the etching process in FIG. 1C, after the Al—Si—Cu thin film 3 is etched using a gas mixture of HBr and $Cl_2$ as an etching gas in place of a gas mixture of $BCl_3$ and $Cl_2$, plasma processing using a gas containing $BCl_3$ or $BBr_3$ as a main component may be performed. In this case, when the flow rate ratio of $BCl_3/Cl_2$ or $BBr_3/Cl_2$ is 50% or more, i.e., when a gas containing 50% or more of $BCl_3$ or $BBr_3$ is used, the Al—Si—Cu thin film 3 can be etched by appropriately changing the pressure and RF power without decreasing the etching selection ratio with respect to the photoresist, degrading the shape of the Al—Si—Cu film, and forming etching residues.

The fourth embodiment of the present invention will be described below.

Figure 6:
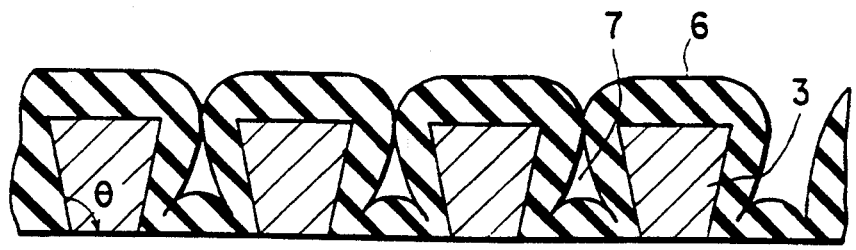
FIG. 6 is a view showing for explaining cavities formed when backward tapered shapes are formed by etching.

When an Al—Si—Cu thin film is etched to form wiring layers, the etch profile is preferably a normal taper because of the following reasons. Although an insulating film is generally formed on the wiring layers by a CVD method, when the etch profile of an Al—Si—Cu thin film 3 is reversely tapered (taper angle $\theta > 90°$) as shown in FIG. 6, intervals between the wiring layers cannot be easily completely buried with an insulating film 6, and cavities 7 are easily formed. When the cavities 7 are formed, floating capacity are formed, and reliability of the device is degraded. The cavities 7 are formed more easily as the interval between the wiring layers is smaller, i.e., as micropatterning advances, thereby preventing integration.

Figure 7:
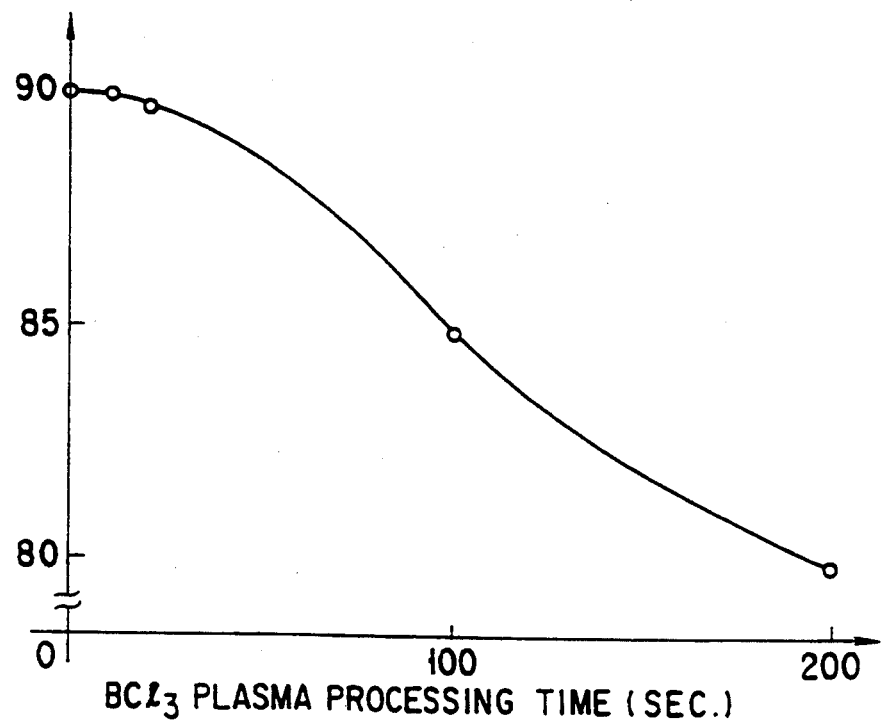
FIG. 7 is a graph showing the relationship between the $BCl_3$ plasma processing time and the taper angle.

FIG. 7 is a graph showing the relationship between the BCl$_3$ plasma processing time and the taper angle, and shows a result obtained by examining a case wherein etching of an Al—Si—Cu thin film for 10 seconds and BCl$_3$ plasma processing for a time which varies from 10 to 200 seconds are alternately repeated.

As is apparent from FIG. 7, as the time for BCl$_3$ plasma processing is longer, the taper angle of the Al—Si—Cu thin film is smaller. In other words, a normal tapered etch profile can be obtained by prolonging the time for BCl$_3$ plasma processing. Therefore, when the time for BCl$_3$ plasma processing is controlled, the etch profile of the Al—Si—Cu thin film can be easily controlled.

The reason why the Al—Si—Cu thin film 3 can be etched to have a normal tapered shape is considered as follows.

Figure 8A:
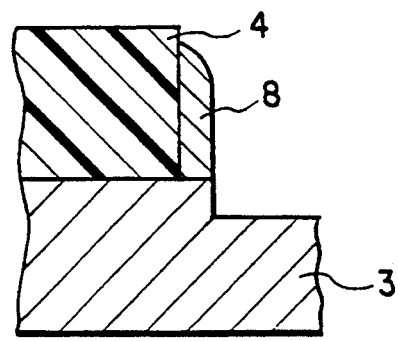
FIGS. 8A to 8D are views for explaining etching processing according to the present invention when processing of a gas having a sputter effect is performed.

An etch profile obtained after the first etching of the Al-Si-Cu thin film 3 and the first BCl$_3$ plasma processing are performed is obtained as follows. That is, a deposit 8 obtained by decomposing the photoresist pattern 4 is deposited on the side portion of the photoresist pattern 4 by the sputter effect of the BCl$_3$ plasma processing, as shown in FIG. 8A. The thickness of this deposit 8 is about 15 nm when the BCl$_3$ plasma processing is performed for, e.g., 100 seconds.

The deposit 8 functions as an etching-resistant mask for the Al—Si—Cu thin film 3 in the next etching. In addition, the etching rate of the deposit 8 is considerably higher than that of the photoresist pattern 4 because of the nature of the deposit 8.

Figure 8B:
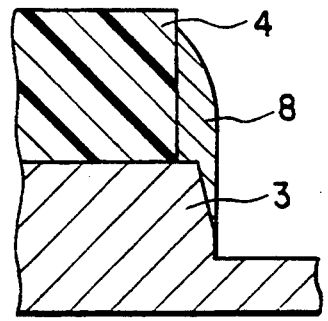
Figure 8C:
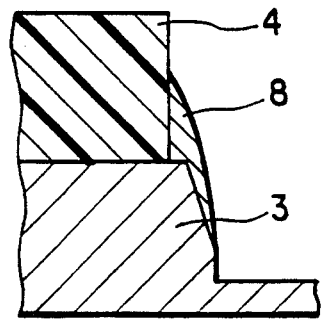
Figure 8D:
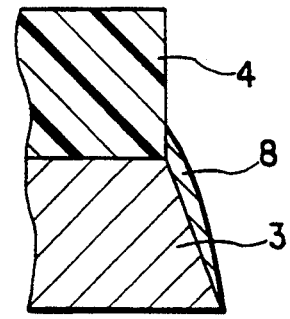

For this reason, as shown in FIGS. 8B, 8C, and 8D, when the second, third, and fourth process pairs of the etching of the Al—Si—Cu thin film 3 and the BCl$_3$ plasma processing are sequentially performed, the thickness of the deposit 8 serving as the etching-resistant mask gradually decreases. Therefore, it is considered that the Al—Si—Cu thin film 3 is etched to have a normal tapered shape.

In this manner, according to this embodiment, Al—Si—Cu wiring layers each having a normal tapered shape can be easily formed by controlling the time for BCl$_3$ plasma processing, and degradation of the reliability of a device caused by cavities can be prevented. Note that, when the time for BCl$_3$ plasma processing is prolonged during the etching of the Al—Si—Cu thin film 3, the vertical etch profile of the Al—Si—Cu thin film 3 can be changed into a normal etch profile.

The present invention is not limited to the above methods. For example, in the embodiments described above, a magnetron type reactive ion etching apparatus having parallel-plate electrodes is used. However, a reactive ion etching apparatus using ECR discharge obtained by applying a microwave, or a reactive ion etching apparatus in which a voltage is applied to a substrate to be etched in a discharge plasma generated by applying a microwave or an electron beam, in a discharge plasma generated by RF power having a frequency of 27 MHz or more, or in a discharge plasma generated by RF power in an inductance coupling scheme may be used.

What is claimed is:

1. A dry etching method comprising
   the first step of forming a mask pattern on a film to be etched containing a plurality of materials having different etching rates;
   the second step of setting an etching gas in a plasma state and anisotropically etching said film to be etched mainly by a chemical action of a plasma of the etching gas using said mask pattern as a mask;
   the third step of setting a gas having a sputter effect in a plasma state and sputter-removing a surface of said film to be etched by a plasma of the gas; and
   wherein the second step and the third step are repeated a plurality of number of times.

2. A method according to claim 1, wherein said film to be etched contains an Al alloy.

3. A method according to claim 1, wherein an oxide film is formed as an underlying layer of said film to be etched.

4. A method according to claim 1, wherein the gas having the plasma effect contains one member selected from the group consisting of BCl$_3$ and BBr$_3$.

5. A method according to claim 1, further comprising the additional step of sputter-removing said film to be etched prior to the second step.

6. A method according to claim 1, wherein the time for the third step is controlled depending on an amount of etching residues obtained in the first step.

7. A method according to claim 1, wherein the time for the third step is controlled depending on a taper angle of an etching pattern to be obtained.

8. A method according to claim 1, wherein the thickness of said film to be etched is 100 to 1,000 nm.

9. A method according to claim 1, wherein the third step is performed by a gas mixture containing the gas having the sputter effect and the gas having the chemical action.

10. A dry etching method comprising:
    the first step of forming a mask pattern on a film to be etched containing, as a main component, an Al alloy containing at least one of Cu and Si;
    the second step of setting an etching gas containing at least one of Cl and Br in a plasma state and anisotropically etching said film to be etched mainly by a chemical action of a plasma of the etching gas using said mask pattern as a mask;
    the third step of setting a gas having a sputter effect in a plasma state and sputter-removing a surface of said film to be etched by a plasma of the gas; and
    wherein the second step and the third step are repeated a plurality of number of times.

11. A method according to claim 10, wherein the time for the third step is controlled depending on an amount of etching residues obtained in the first step.

12. A dry etching method comprising:
    the first step of forming a mask pattern on a film to be etched containing, as a main component, an Al alloy containing at least one of Cu and Si;
    the second step of setting an etching gas in a plasma state and anisotropically etching said film to be etched mainly by a chemical action of a plasma of the etching gas using said mask pattern as a mask;
    the third step of setting a gas having a sputter effect in a plasma state and sputter-removing a surface of said film to be etched by a plasma of the gas; and
    wherein the second step and the third step are repeated a plurality of number of times.

13. A method according to claim 10, wherein the time for the third step is controlled depending on a taper angle of an etching pattern to be obtained.

14. A method according to claim 12, wherein the gas having the plasma effect contains one member selected from the group consisting of BCl$_3$ and BBr$_3$.

15. A method according to claim 10, wherein the thickness of said film to be etched is 100 to 1,000 nm.

16. A method according to claim 12, wherein the time for the third step is controlled depending on an amount of etching residues obtained in the first step.

17. A method according to claim 12, wherein the time for the third step is controlled depending on a taper angle of an etching pattern to be obtained.

18. A method according to claim 12, wherein the thickness of said film to be etched is 100 to 1,000 nm.

19. A method according to claim 12, wherein the third step is performed by a gas mixture containing the gas having the sputter effect and the gas having the chemical reaction.

20. A method according to claim 12, further comprising the additional step of sputter-removing said film to be etched prior to the second step.

21. A method according to claim 10, wherein the third step is performed by a gas mixture containing the gas having the sputter effect and the gas having the chemical reaction.

22. A method according to claim 10, further comprising the additional step of sputter-removing said film to be etched prior to the second step.

* * * * *